United States Patent
Peng et al.

(10) Patent No.: US 10,177,280 B2
(45) Date of Patent: Jan. 8, 2019

(54) LIGHT EMITTING DIODE

(71) Applicant: ADVANCED OPTOELECTRONIC TECHNOLOGY, INC., Hsinchu Hsien (TW)

(72) Inventors: Chien-Chung Peng, Hsinchu (TW); Chien-Shiang Huang, Hsinchu (TW); Chia-Hui Shen, Hsinchu (TW); Tzu-Chien Hung, Hsinchu (TW)

(73) Assignee: ADVANCED OPTOELECTRONICS TECHNOLOGY, INC, Hsinchu Hsien (TW)

( * ) Notice: Subject to any disclaimer, the term of this patent is extended or adjusted under 35 U.S.C. 154(b) by 0 days.

(21) Appl. No.: 15/492,164

(22) Filed: Apr. 20, 2017

(65) Prior Publication Data
US 2018/0040785 A1    Feb. 8, 2018

(30) Foreign Application Priority Data
Aug. 3, 2016 (CN) .......................... 2016 1 0623516

(51) Int. Cl.
| H01L 33/46 | (2010.01) |
| H01L 33/38 | (2010.01) |
| H01L 33/50 | (2010.01) |
| H01L 33/54 | (2010.01) |
| H01L 33/56 | (2010.01) |

(52) U.S. Cl.
CPC .............. *H01L 33/46* (2013.01); *H01L 33/38* (2013.01); *H01L 33/507* (2013.01); *H01L 33/54* (2013.01); *H01L 33/56* (2013.01)

(58) Field of Classification Search
CPC .......... H01L 33/52; H01L 33/56; H01L 33/60
See application file for complete search history.

(56) References Cited

U.S. PATENT DOCUMENTS

| 9,478,719 B2 * | 10/2016 | West ........................ H01L 33/46 |
| 9,922,963 B2 * | 3/2018 | Hung .................. H01L 25/0753 |
| 9,997,676 B2 * | 6/2018 | Hung ....................... H01L 33/50 |
| 2012/0223351 A1 * | 9/2012 | Margalit ............... H01L 33/382 |
| | | 257/98 |
| 2013/0037842 A1 * | 2/2013 | Yamada .................. H01L 33/60 |
| | | 257/98 |
| 2015/0179901 A1 * | 6/2015 | Ok ........................ H01L 33/504 |
| | | 257/98 |

(Continued)

FOREIGN PATENT DOCUMENTS

| TW | 201526298 A | 7/2015 |
| TW | 201614875 A | 4/2016 |

*Primary Examiner* — Andres Munoz
(74) *Attorney, Agent, or Firm* — ScienBiziP, P.C.

(57) ABSTRACT

A light emitting diode include a light emitting chip, a first reflecting layer surrounding the light emitting diode chip, a first encapsulation layer and a second encapsulation layer covering on the light emitting diode chip. The light emitting chip has a light exiting surface, a first electrode and a second electrode. the first electrode and the second electrode are located opposite to the light exiting surface. Further, a second reflecting layer surrounds the periphery of the light emitting chip and also locates between the first encapsulation layer and the second encapsulation layer. A reflectivity of the first reflecting layer is greater than a reflectivity of the first reflecting layer. A bottom surface of the first electrode and the second electrode are exposed from the first reflecting layer.

10 Claims, 2 Drawing Sheets

(56) References Cited

U.S. PATENT DOCUMENTS

2016/0013381 A1\* 1/2016 Ting .................. H01L 33/60
                                                                                          257/98
2016/0276554 A1\* 9/2016 Huang ............. H01L 33/505
2016/0372642 A1\* 12/2016 Cho .................. H01L 33/58

\* cited by examiner

LIGHT EMITTING DIODE

CROSS-REFERENCE TO RELATED APPLICATIONS

This application claims priority to Chinese Patent Application No. 201610623516.0 filed on Aug. 3, 2016, the contents of which are incorporated by reference herein.

FIELD

The subject matter herein generally relates to a light emitting component, especially relates to a light emitting diode.

BACKGROUND

A light emitting diode (LED) is a semiconductor component which converts the current into light waves with different colors and wavelengths. The light emitting diode is widely used in illumination because of its low power consumption, long life and environmental protection.

Usually, the light emitting diode includes a base, a chip mounted on the base, a reflecting cup mounted on the base and around the chip, an encapsulation layer filled in the reflecting cup and selectively configured a lens on the reflecting cup to change a emitting angle of the chip. Light emitting from the chip exits through the top of the reflecting cup and the lens. However, an inner surface of the reflecting cup reflects light emitted from the chip to excite phosphors mixed in the encapsulation layer to exit from the encapsulation layer. Thus, a color temperature distributed on a top center and periphery of the reflecting cup has an obviously difference.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure. The description is not to be considered as limiting the scope of the exemplary embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
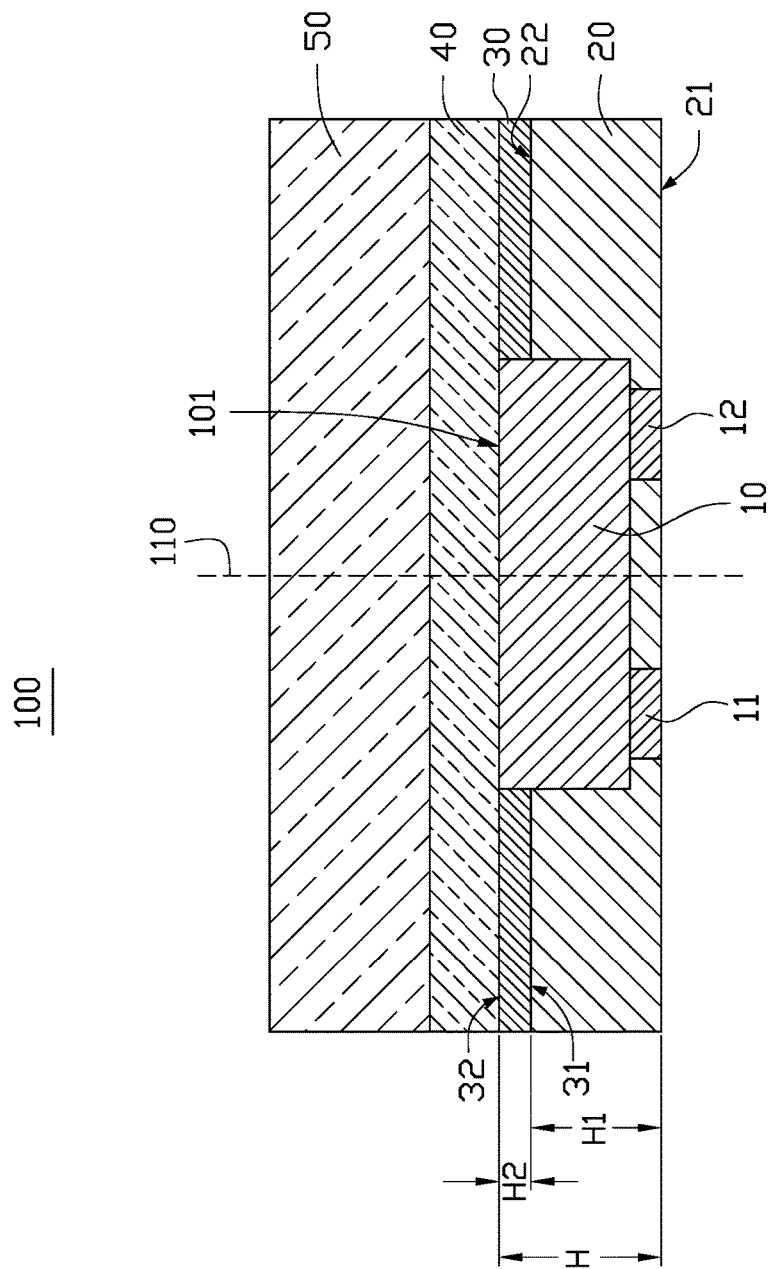
FIG. 1 is a cross sectional view of a light emitting diode.

As illustrated in FIG. 1, an light emitting diode 100 of the present disclosure includes an light emitting chip 10, a first reflecting layer 20 and a second reflecting layer 30 both surrounding the light emitting chip 10, a first encapsulation layer 40 and a second encapsulation layer 50 covered on the light emitting chip 10.

The light emitting diode 100 has an axis 110. The light emitting chip 10, the first reflecting layer 20, the second reflecting layer 30, the first encapsulation layer 40 and the second encapsulation layer 50 are symmetrical about an axis 110. Further, an outer surface of the first reflecting layer 20, the second reflecting layer 30, the first encapsulation layer 40 and the second encapsulation layer 50 are coplanar.

The light emitting chip 10 has a light exiting surface 101, a first electrode 11 and a second electrode 12. The first electrode 11 and the second electrode 12 are located on a surface of the light emitting chip 10 opposite to the light exiting surface 101. The light emitting diode 100 may include a plurality of light emitting chip 10.

In the illustrated exemplary embodiment, the light emitting chip 10 may emit blue light, red light or green light. A bottom surface of the first electrode 11 and a bottom surface of the second electrode 12 are both exposed from the first reflecting layer 20. In the instant exemplary embodiment, the first electrode 11 is a P electrode, and the second electrode 12 is an N electrode. It can be understood that the first electrode 11 is an N electrode, and the second electrode 12 is a P electrode.

A vertical height of the light emitting chip 10 is represented with H, a vertical height of the first reflecting layer 20 is represented with H1, and a vertical height of the second reflecting layer 30 is represented with H2. Thus, H, H1, and H2 satisfy the relation: H=H1+H2.

The first reflecting layer 20 is made of opaque and high reflectivity materials. The first reflecting layer 20 is formed around of a periphery of the light emitting chip 10. The first reflecting layer 20 has a first surface 21 and a second surface 22 opposite to the first surface 21. The first surface 21 is coplanar with the bottom surface of the first electrode 11 and the second electrode 12. The second surface 22 is positioned lower in height with respect to the light exiting surface 101 of the light emitting chip 10.

The second reflecting layer 30 is made of low reflectivity materials, such as chromium, however, the low reflectivity material is not limited to the examples provided in the exemplary embodiment. The second reflecting layer 30 locates between the first reflecting layer 20 and the first encapsulation layer 40 to surround the periphery of the light emitting chip 10.

The second reflecting layer 30 has a bottom surface 31 and a top surface 32 opposite to the bottom surface 31. The bottom surface 31 attaches to the second surface 22 of the first reflecting layer 20. The top surface 32 is coplanar with the light exiting surface 101 of the light emitting chip 10. A reflectivity of the second reflecting layer 30 is lower than a reflectivity of the first reflecting layer 20.

In the illustrated exemplary embodiment, the second reflecting layer 30 is made of a material having a reflectivity less than 40 percent. The vertical height of the second reflecting layer 30 is H2, H2>100 nm. The second reflecting layer 30 absorbs light emitted from the periphery of the light emitting chip 10 to prevent the emitting angle of the light emitting chip from increasing.

The first encapsulation layer 40 is made of high transparent thermal conductive materials. The first encapsulation layer 40 covers the light emitting chip 10 and the second reflecting layer 30. The first encapsulation layer 40 attaches to the light exiting surface 101 of the light emitting chip 10 and the top surface 32 of the second reflecting surface 30. Light emitted from the light emitting chip 10 can pass through the first encapsulation 40. The first encapsulation layer 40 also can absorb most of heat from the light emitting chip 10 to improve heat dissipation of the light emitting chip 10.

The second encapsulation layer 50 is made of adhesives. The second encapsulation layer 50 is mounted on the first encapsulation layer 40. A vertical height of the second encapsulation layer 50 is greater than a vertical height of the first encapsulation layer 40. Furthermore, in the illustrated exemplary embodiment, the second encapsulation layer 50 includes phosphors therein.

Figure 2:
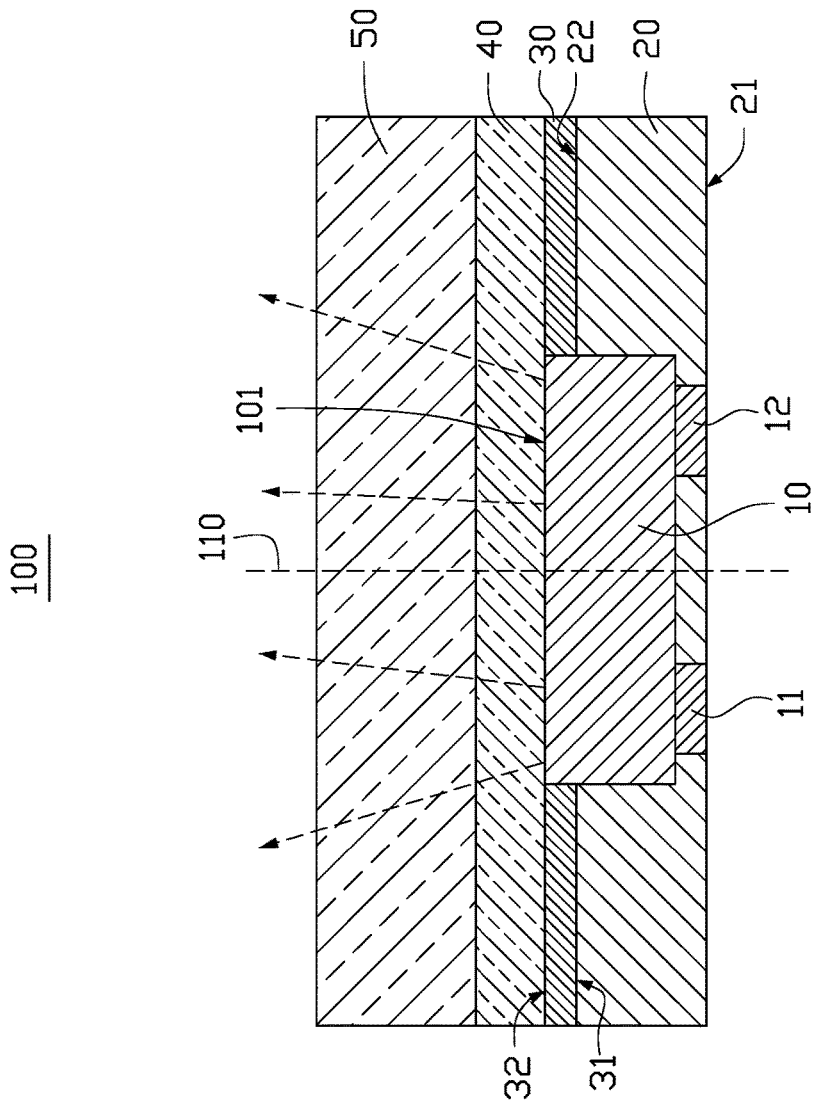
FIG. 2 is another cross-sectional view of the light emitting diode of FIG. 1.

Also as illustrated in FIG. 2, light emitted from the light emitting chip 10 and near the axis 110 exits through the first encapsulation 40 and the second encapsulation layer 50. Light emitted from the periphery of the light emitting chip 10 and away from the axis 110 is reflected by the first reflecting layer 20 direct to the first encapsulation layer 40. Some light reflected by the first reflecting layer 20 towards the periphery of the light exiting surface 101 are absorbed by the second reflecting layer 30 to prevent the emitting angle of the light emitting chip 10 from increasing. Thus, the second reflecting layer 30 can prevent light from generating a halo. Therefore, the light color temperature of the light emitting diode 100 is uniform.

The exemplary embodiments shown and described above are only examples. Many details are often found in the art such as the other features of a light emitting diode. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A light emitting diode, comprising:
a light emitting chip having a light exiting surface, a first electrode and a second electrode, the first electrode and the second electrode being located opposite to the light exiting surface;
a first reflecting layer directly surrounding and contacting a periphery of the light emitting chip and a periphery of the first and the second electrodes, the first reflecting layer having a first surface and a second surface opposite to the first surface, the second surface is positioned lower in height with respect to the light exiting surface;
a second reflecting layer also directly surrounding and contacting the periphery of the light emitting chip, the second reflecting layer having a bottom surface and a top surface opposite to the bottom surface, the bottom surface directly attached to the second surface, the top surface being a topmost surface of the second reflecting layer and coplanar with the light exiting surface, a reflectivity of the second reflecting layer less than a reflectivity of the first reflecting layer, bottoms of the first electrode and the second electrode exposed from the first reflecting layer;
a first encapsulation layer covering the light emitting surface and the entire top surface; and
a second encapsulation layer covering the first encapsulation layer;
wherein, the second reflecting layer is made of a material having a reflectivity less than 40 percent, a vertical height of the second reflecting layer is greater than 100 nm.

2. The light emitting diode of claim 1, wherein the first surface is coplanar with the bottoms of both the first electrode and the second electrode.

3. The light emitting diode of claim 2, wherein the first encapsulation layer is made of transparent thermal conductive materials.

4. The light emitting diode of claim 1, wherein a vertical height of the light emitting chip is represented with H, a vertical height of the first reflecting layer is represented with H1, and the vertical height of the second reflecting layer is represented with H2, the vertical height of the light emitting chip is a sum of the vertical height of the first reflecting layer and the vertical height of the second reflecting layer.

5. The light emitting diode of claim 1, wherein the second encapsulation layer is made of adhesives, a vertical height of the second encapsulation layer is greater than a vertical height of the first encapsulation layer.

6. The light emitting diode of claim 1, wherein the second encapsulation layer includes phosphors therein.

7. The light emitting diode of claim 1, wherein the light emitting diode has an axis, the light emitting chip, the first reflecting layer, the second reflecting layer, the first encapsulation layer and the second encapsulation layer are symmetrical about the axis.

8. The light emitting diode of claim 1, wherein an outer surface of the first reflecting layer, the second reflecting layer, the first encapsulation layer and the second encapsulation layer are coplanar.

9. The light emitting diode of claim 1, wherein the first electrode is a P electrode, and the second electrode is an N electrode.

10. The light emitting diode of claim 1, wherein the first electrode is an N electrode, and the second electrode is a P electrode.

* * * * *